United States Patent [19]
Jost

[11] Patent Number: 5,218,321
[45] Date of Patent: Jun. 8, 1993

[54] LOW OFFSET UNITY GAIN BUFFER AMPLIFIER

[75] Inventor: Steven R. Jost, Palm Bay, Fla.

[73] Assignee: Harris Corporation, Melbourne, Fla.

[21] Appl. No.: 717,347

[22] Filed: Jun. 18, 1991

[51] Int. Cl.[5] .............................................. H03F 3/26
[52] U.S. Cl. .................................... 330/263; 330/267
[58] Field of Search ............... 330/263, 267, 288, 296, 330/9

[56] References Cited

U.S. PATENT DOCUMENTS 4,525,682 6/1985 Lai et al. .............................. 330/288
4,639,685 1/1987 Saller et al. .......................... 330/263

Primary Examiner—Steven Mottola
Attorney, Agent, or Firm—Evenson, Wands, Edwards, Lenahan & McKeown

[57] ABSTRACT

A buffer amplifier configuration simultaneously reduces d.c. voltage offsets through the signal flow path between its input and output and maintains a high input impedance and a low output impedance. In a preferred embodiment, high input impedance is achieved by coupling the input transistor's collector to a high impedance current source, which is coupled to one of the buffer's power supply rails. The emitter of the input transistor is coupled to the input terminal and its base of the base of a like polarity bipolar output transistor, the emitter of which is coupled to an output terminal and the collector of which is coupled to one supply rail. Since both the input and output transistors are of the same polarity type (so that they can be reasonably well matched during manufacture) and have their base-emitter junctions connected back-to-back between the input and output terminals, they impart effectively no Vbe-based d.c. offset voltage through the buffer. To ensure a high input impedance regardless of output load and output stage gain an isolating emitter-follower transistor stage is preferably coupled between the collector of the input transistor stage and the base of the output transistor stage.

26 Claims, 4 Drawing Sheets

LOW OFFSET UNITY GAIN BUFFER AMPLIFIER

FIELD OF THE INVENTION

The present invention relates in general to amplifier circuits and is particularly directed to a bipolar transistor-configured, unity gain buffer amplifier that enjoys a low offset voltage between its input and its output.

BACKGROUND OF THE INVENTION

Buffer amplifiers providing high input and low output impedances and which operate over a wide frequency range are employed in a variety of signal processing circuits. A fundamental design of a bipolar transistor buffer amplifier, described by Knitter and Zuch in an article entitled "Unity Gain Buffer Amplifier is Ultrafast", Electronics, April 1978, pp. 124–124, is schematically shown in FIG. 1 as comprising a pair of push-pull stages coupled between an input terminal 20 and an output terminal 50. A first (push-pull) stage of the amplifier comprises an NPN input emitter follower transistor 10 the base 12 of which is coupled to input terminal 20, the collector 14 of which is coupled to a positive voltage supply rail 22 and the emitter 16 of which is coupled to a first current source 30 referenced to a negative voltage supply rail 24. The emitter 16 of input transistor 10 is coupled to the base 42 of an output PNP transistor 40, the collector 44 of which is coupled to the negative supply rail 24 and the emitter of which is coupled to output terminal 50.

A second push-pull stage comprises a PNP input emitter follower transistor 60 the base 62 of which is coupled to input terminal 20, the collector 64 of which is coupled to negative voltage supply rail 24 and the emitter 66 of which is coupled to a second current source 70 referenced to the positive voltage supply rail 22. The emitter 66 of input transistor 60 is coupled to the base 82 of an output NPN transistor 80, the collector 84 of which is coupled to the positive supply rail 22 and the emitter of which is coupled to output terminal 50.

The circuit configuration of FIG. 1 provides a high input impedance since input terminal 20 is coupled to base terminals of the input transistors 10 and 60, and provides a low output impedance since output terminal 50 is coupled to emitter terminals of the output transistors 40 and 80. The circuit's wide frequency response is achieved by coupling the signal flow path through emitter-follower transistor stages which are capable of operating at close to ft. Moreover, by selecting the magnitudes of current sources 30 and 70 to be sufficiently large to drive the parasitic base-to-collector capacitances of output transistors 40 and 80, the buffer is capable of achieving a high slew rate.

A major shortcoming of the circuit design of FIG. 1 is a d.c. input-output offset voltage through the base-emitter junctions of each push-pull stage. In the signal flow path through emitter follower input transistor 10 and output transistor 40, for example, there is a d.c. offset imparted by the series connection of base-emitter junction voltage Vbe of NPN transistor 10 and the base-emitter junction voltage Vbe of PNP transistor 40. How well this offset is minimized depends upon how well semiconductor processing parameters are able to match the NPN and PNP transistors. Since the respective input and output transistors are of opposite polarity types, the doping steps forming their base and emitter regions are carried out separately. Consequently, it can be expected that the devices will not match, so that a voltage offset (typically on the order of 20–40 millivolts) remains.

While d.c. offset may not be significant in all applications, it is critical at an input to a current feedback amplifier, as described in the U.S. Pat. to Nelson Nos. 4,358,739 and 4,502,020. In order for current feedback amplifiers, which offer certain advantages in terms of bandwidth, slew rate and settling time, to achieve the same degree of precision available in conventional voltage feedback operational amplifiers, it is necessary to substantially reduce the above-described d.c. voltage offset problem.

One proposal for reducing offset and also temperature drift in such a buffer amplifier design is shown in FIG. 2, which schematically represents a solution to the problem described in the U.S. Pat. to Saller et al No. 4,639,685. Specifically, respective complementary pairs of diode-connected transistors, which are sized to match the components of each push-pull stage, are coupled in the respective signal flow paths from input terminal 20 to output terminal 50. Thus, an additional diode-connected NPN transistor 110 is coupled between output terminal 50 and the emitter of PNP output transistor 40 in order to match out the Vbe of NPN input transistor 10, and an additional diode connected PNP transistor 160 is coupled between output terminal 50 and the emitter of NPN output transistor 80 in order to match out the Vbe of PNP input transistor 60. Similarly, an additional diode-connected NPN transistor 140 is coupled between the emitter of input transistor 10 and the base of output transistor 40 in order to match out the Vbe of PNP output transistor 40, and an additional diode-connected NPN transistor 180 is coupled between the emitter of PNP input transistor 60 and the base of output transistor 80 in order to match out the Vbe of NPN output transistor 80. In the circuitry configuration of FIG. 2, as long as the offset-complementing diode-connected transistors match their like polarity counterparts, offset and drift should be nulled. In practice, however, due to the inexactness of integrated circuit processing there can be expected to be some minor degree of residual mismatch between devices. Still, the residual offset and drift is typically an order of magnitude lower than what can be achieved by attempting to simply match opposite polarity devices.

Now although the circuit design of FIG. 2 substantially reduces the offset and drift problem of FIG. 1, it does not well serve the needs of a current feedback amplifier which requires that the output impedance of an associated input buffer amplifier stage be relatively low. By the addition of offset-compensating transistor diodes 110 and 160 in the output stages, the output impedance looking back into terminal 50 is effectively increased from that of FIG. 1. Moreover, the diode-connected transistors must have low parasitic collector resistance to avoid saturation and a drastic change in Vbe. This typically implies that the devices must be large area devices and therefore the matching transistors must also be large (in order for their emitter areas to match). Unfortunately, increasing the areas of the devices increases their parasitic capacitances thereby reducing signal processing speed. In addition, a finite early voltage will cause the transistor diodes to mismatch the other transistors, since they operate at different base-to-collector voltages.

SUMMARY OF THE INVENTION

In accordance with the present invention drawbacks of the approaches of FIGS. 1 and 2, discussed above, are obviated by a buffer amplifier configuration which simultaneously reduces d.c. voltage offsets through the signal flow path between input and output while maintaining a high input impedance and a low output impedance. To this end, rather than increase the complexity of the device by adding offset-compensating components which, in the course of 'matching' out offsets, may also introduce unwanted parasitics as described above, the present invention arranges the amplifier components of each push pull stage so as to inherently provide offset compensation and, at the same time, incorporates impedance augmenting functionality in the input stage, so as to maintain a high input impedance, without also increasing the impedance seen at the output terminal.

Pursuant to a preferred embodiment of the present invention, rather than achieving a high input impedance by coupling the input to the base terminal of an bipolar input transistor stage, the input is coupled to the emitter terminal of the input transistor stage. High input impedance is achieved by coupling the input transistor's collector to a high impedance current source, which is coupled to one of the buffer's power supply rails (voltage reference supply terminals). The base of the input transistor is coupled to the base of a like polarity bipolar output transistor, the emitter of which is coupled to an output terminal and the collector of which is coupled to one supply rail. Since both the input and output transistors are of the same polarity type (so that they can be reasonably well matched during manufacture) and have their base-emitter junctions connected back-to-back between the input and output terminals, they impart effectively no Vbe-based d.c. offset voltage through the buffer. Consequently, additional compensating transistor diodes as in the prior art configuration of FIG. 2 are not required, and the output impedance is not increased.

In order to ensure a high input impedance regardless of output load and output stage gain an isolating emitter-follower transistor stage is preferably coupled between the collector of the input transistor stage and the base of the output transistor stage. This isolating transistor stage is of the same polarity as the emitter-follower and serves to translate the output impedance by the product of the gains of the output and isolation transistor stages to the collector of the input stage, thus ensuring a high input impedance. Associated with the isolation transistors of the respective push-pull stages are current sources coupled between their emitters and the supply rails.

DETAILED DESCRIPTION

Figure 3:
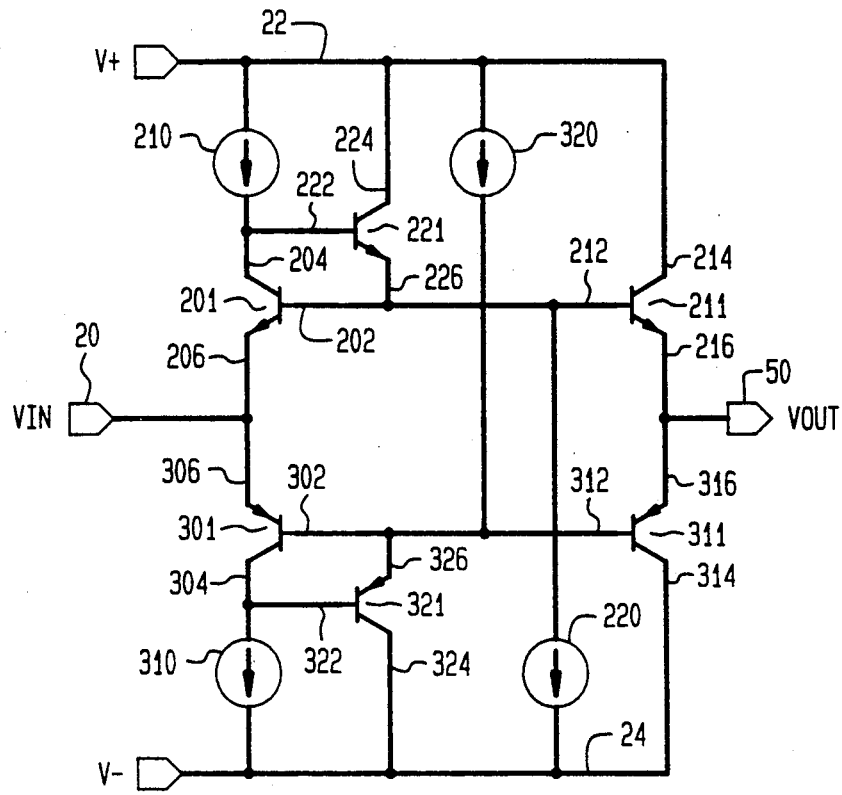
FIG. 3 is a schematic diagram of a preferred embodiment of the present invention.

Referring now to FIG. 3 a preferred embodiment of an improved unity gain buffer amplifier in accordance with the present invention is schematically illustrated as comprising a push-pull configuration having first and second stages S1 and S2. The first or upper stage S1 comprises an NPN input bipolar transistor 201 having its collector electrode 204 coupled to a first high impedance current source 210 which is referenced to positive power supply rail 22. Input transistor 201 has its emitter electrode 206 coupled to input terminal 20 and its base electrode 202 coupled to the base electrode 212 of an NPN emitter-follower output transistor 211. Output transistor 211 has a collector electrode 214 coupled to power supply rail 22, its emitter electrode 216 coupled to output terminal 50 and its base electrode 212 additionally coupled to a current source 220 which is referenced to negative power supply rail 24.

The signal voltage at the collector electrode 204 of input transistor 201 is coupled to the base electrode 212 of output transistor 211. In its simplest form this connection may be accomplished by means of a direct wire connection, which effectively connects the base and collector of input transistor 201 in common as a diode-connected input device. However, in a preferred embodiment of the invention, the collector electrode 204 of input transistor 201 is coupled to the base electrode 212 of output emitter-follower transistor by means of an NPN emitter-follower isolation transistor stage 221 which serves to further multiply the output impedance seen at the base of output transistor 211 by the gain of stage 221, thereby maintaining a high impedance at the collector of input transistor 201. Impedance multiplying transistor 221 has a base electrode 222 connected to collector 202 of transistor 201, a collector electrode 224 connected to positive supply rail 22 and an emitter electrode 226 connected to the base electrode 212 of output transistor 211.

The second, complementary stage S2 of the push-pull configuration of FIG. 3 contains a PNP input transistor 301 having its collector electrode 304 coupled to a second high impedance current source 310 which is referenced to positive power supply rail 24. Input transistor 301 has its emitter electrode 306 coupled to input terminal 20 and its base electrode 302 coupled to the base electrode 312 of a PNP emitter-follower output transistor 311. Output transistor 311 has a collector electrode 314 coupled to negative power supply rail 22, an emitter electrode 316 coupled to output terminal 50 and a base electrode 312 additionally coupled to a current source 320 which is referenced to positive power supply rail 22.

As in the case of upper stage S1, the signal voltage at the collector electrode 304 of PNP input transistor 301 is coupled to the base electrode 312 of transistor 311; again in accordance with a preferred embodiment of the invention, collector electrode 304 of input transistor 301 is coupled to the base electrode 312 of output emitter follower transistor by means of an output impedance multiplying PNP emitter-follower transistor stage 321 having a base electrode 322 connected to collector 302 of transistor 301, a collector electrode 324 connected to negative supply rail 24 and an emitter electrode 326 connected to the base electrode 312 of PNP output transistor 311.

In each of the upper and lower stages S1 and S2 of the push-pull configuration of FIG. 3, because the input and output transistors are coupled such that their forward base-emitter voltage drops Vbe are in opposite directions in the signal flow path from input to output, d.c voltage offset between input terminal 20 and output terminal 50 is minimized. Indeed, since input transistor 201 and output transistor 212 of upper stage S1 are of the same polarity type (NPN) and since input transistor 301 and output transistor 312 of lower stage S2 are of the same polarity type (PNP), so that they can be reasonably well matched during manufacture, a substantial reduction in d.c. offset through the circuit is achieved.

The manufacturing process in which the circuit is laid out for semiconductor fabrication, etc., may include trimming the transistors 201, 211, 301, or 311 using a laser or other suitable means. Trimming may achieve even more exact matching between the components to further reduce the offset voltage. The high impedance current sources 210 and 310 may be implemented to include a resistor or other component whose value determines the current. This resistor or other component may also be trimmed during manufacture for improved matching.

Figure 2:
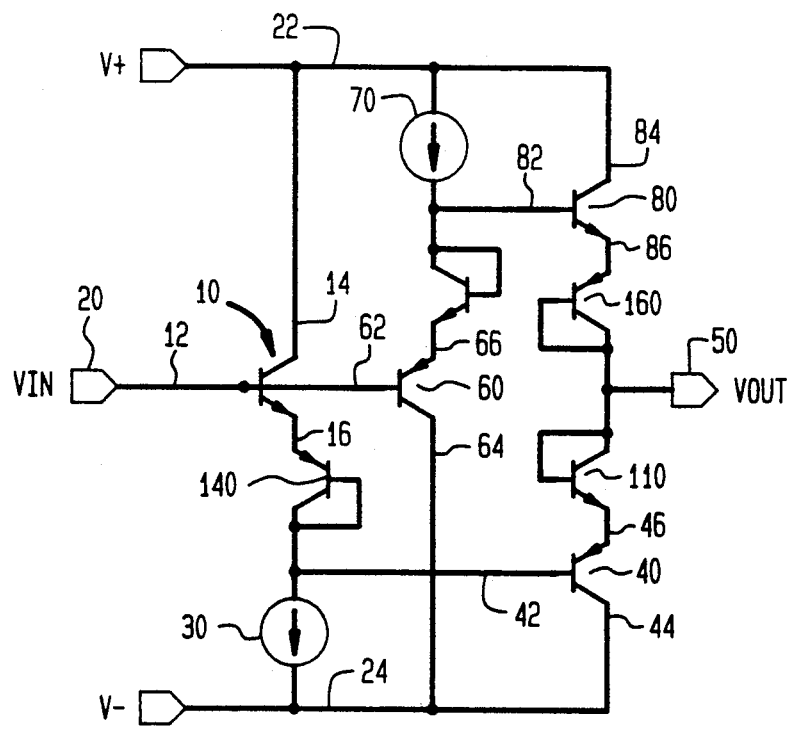
FIG. 2 shows a prior art modification of the buffer amplifier of FIG. 1 for reducing d.c. offset and temperature drift.

Moreover, unlike the configuration of FIG. 2, which suffers from an increased output impedance as a result of the addition of offset-compensating transistor diodes in the output stages, the output impedance of the embodiment of the present invention can be maintained at a low value defined by: $(\frac{1}{2})(kT/qIc)$, where Ic is the collector current of transistor 211 or 311, and $kT/q=26$ mv at room temperature. For example, if $Ic=10$ mA, then $Rout \simeq 1.3$ at room temperature. Similarly, if $Ic=mA$, $Rout \simeq 13\Omega$ ac room temperature.

Even though the input transistor has its emitter coupled to the input terminal (e.g. the emitter 206 of NPN input transistor 201 is coupled to input terminal 20) a high input impedance (e.g. on the order of several hundred KΩ is achieved by coupling the collector of the input transistor to a high impedance current source. In order to ensure a high input impedance regardless of output load and output stage gain an isolating emitter-follower transistor stage (e.g. emitter-follower stage 221) is coupled between the collector of the input transistor stage and the base of the output transistor stage. This isolating emitter-follower transistor stage serves to translate the output impedance by the product of the current gains (i.e. $\beta$) of the output and isolation transistor stages to the collector of the input stage, thus ensuring a high input impedance.

Buffer amplifier circuits in accordance with the invention may be put to numerous applications such as computer systems, automotive systems, component or composite video systems such as high definition television, video buffer applications, video distribution systems, radar systems, video radar image processors, or wideband systems. Essentially, any system having a first electrode at which a voltage is provided and a second electrode to which the voltage is to be coupled with low offset may employ a circuit in accordance with the invention.

Figure 1:
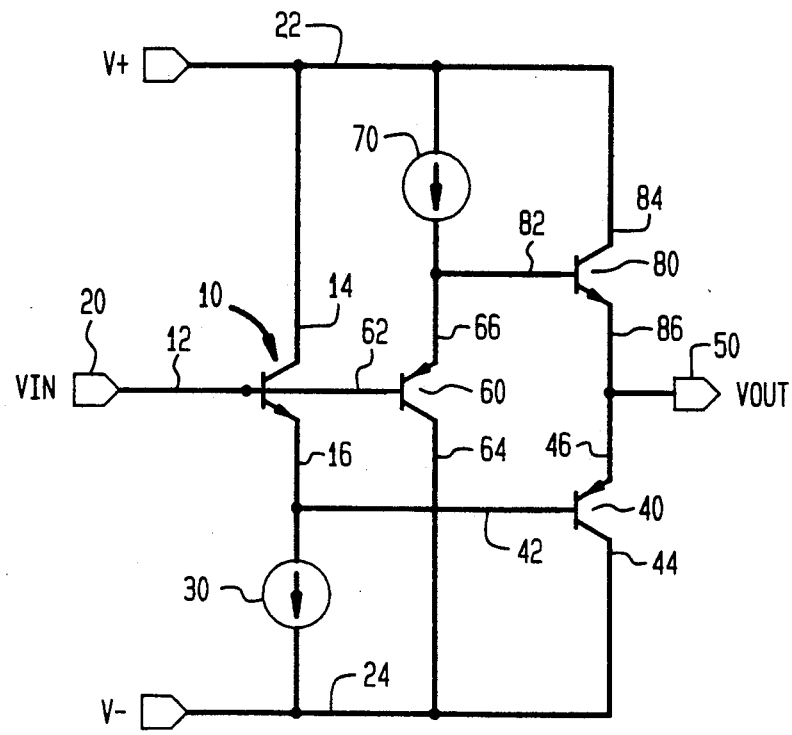
FIG. 1 schematically shows a fundamental prior art bipolar transistor buffer amplifier.
Figure 4:
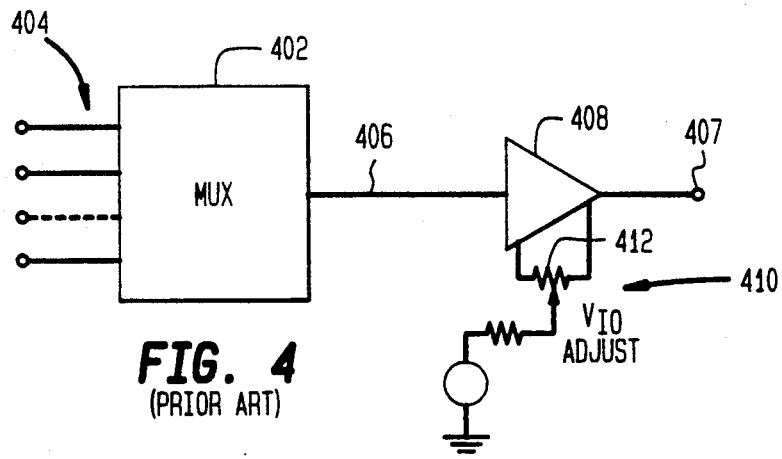
FIG. 4 is a block diagram of a portion of an electronic system employing a conventional buffer amplifier circuit.

In conventional systems such as those listed above, designers have attempted to compensate for the high voltage offset from buffer amplifiers by adding compensation circuitry. For instance, FIG. 1 is a block diagram of an exemplary portion of a system such as one of those listed above. In FIG. 4, a multiplexer 402 has a plurality of inputs collectively shown as 404 and coupled to receive various signals. An output 406 of the multiplexer 402 is to be coupled to an electrode 407 with low voltage offset. As shown, a conventional buffer amplifier 408 having unsatisfactorily high voltage offset is coupled between the output 406 of the multiplexer 402 and the electrode 407. In order to compensate for the high voltage offset of the buffer amplifier 408, a $V_{ic}$ adjust circuit 410 is provided. As shown, a typical adjust circuit 410 may include a potentiometer 412 coupled to the buffer amplifier 408 to provide a variable resistance or other variable parameter which may be set to a value which substantially compensates for the voltage offset of the buffer amplifier 408. It is disadvantageous to go to the extra cost and labor of including the adjust circuit 410 and adjusting it for each system built.

Figure 5:
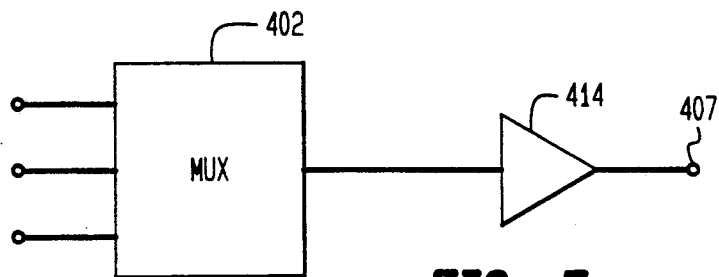
FIG. 5 is a block diagram of a portion of an electronic system employing a buffer amplifier circuit according to the invention.

By contrast, FIG. 5 is a block diagram of a section of a system which replaces the conventional buffer amplifier 408 with a buffer amplifier 414 according to the invention. As shown, the adjust circuit 410 is no longer necessary. By using a buffer amplifier circuit 414 in accordance with the invention, parts and labor are saved.

Figure 6:
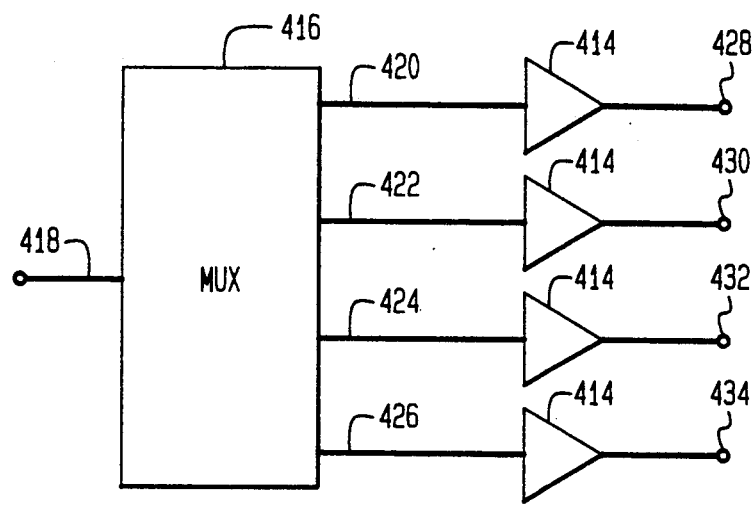
FIG. 6 is a block diagram of another portion of an electronic system employing buffer amplifier circuits according to the invention.

FIG. 6 is a block diagram of another section of a system such as one of those listed. In FIG. 6, a demultiplexer 416 has an input 418 and a plurality of outputs 420, 422, 424, and 426. The outputs are to be coupled to electrodes 428, 430, 432, and 434, respectively, with low voltage offset. In another typical application of a buffer amplifier according to the invention, amplifiers 414 similar to that of FIG. 5 are provided between each of the respective outputs and electrodes. If conventional buffer amplifiers such as 408 were used, each one would require an adjust circuit 410. Thus a considerable amount of circuitry overall may be saved by using buffer amplifiers 414 in accordance with the invention in systems such as those listed.

Figure 7:
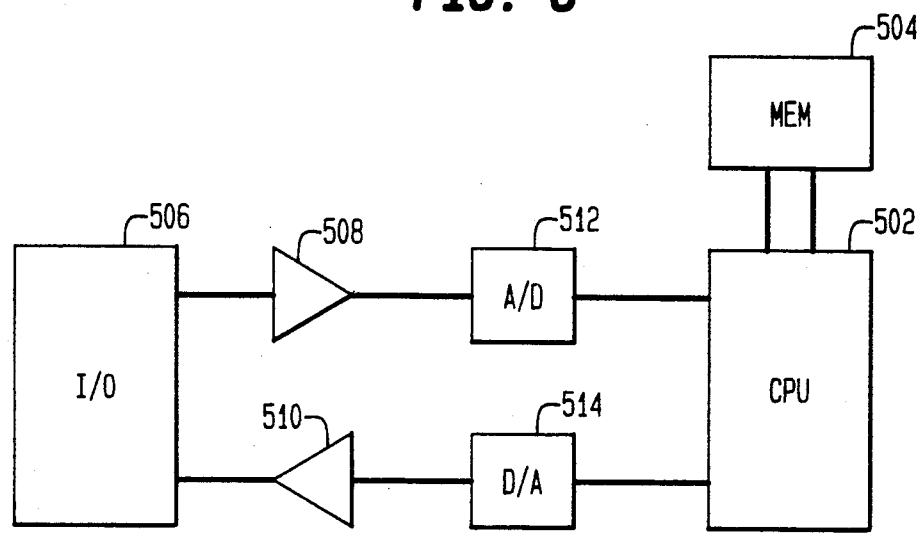
FIG. 7 diagramatically illustrates a computer system including a central processing unit, a memory and an input/output unit.

FIGS. 7–10 are system block diagrams showing how buffer amplifier circuits according to the invention could be employed. FIG. 7 is a computer system including a central processing unit (CPU) 502, a memory 504, and input/output (I/O) 506. As one example of how the buffer amplifiers according to the invention could be employed, two such circuits 508 and 510 are coupled between the CPU 502 and the I/O 506 for bidirectional communication. Suitable analog-to-digital and digital-to-analog converters 512 and 514 may be provided in series with the buffer amplifiers 508 and 510 as shown.

Figure 8:
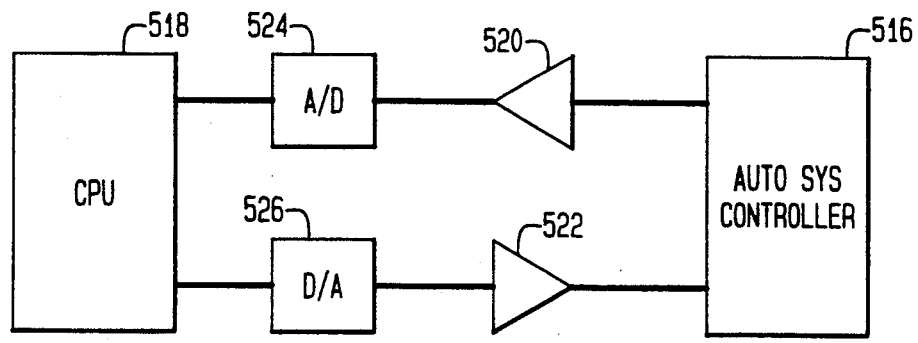
FIG. 8 is a system block diagram of an automotive system employing buffer amplifiers according to the present invention.

FIG. 8 is a system block diagram of an automotive system employing buffer amplifiers according to the invention. An auto system controller 516 could be, for instance, an electromechanical device such as a steering controller, a fuel injection system, an interior ventilation or air-conditioning system, etc. The controller 516 is operated by commands from a CPU 518. In accordance with the invention, buffer amplifiers 520 and 522 may be coupled between the CPU 518 and the controller 516 for bidirectional communication as shown. Again, A/D and D/A converters 524 and 526 may be provided as necessary.

Figure 9:
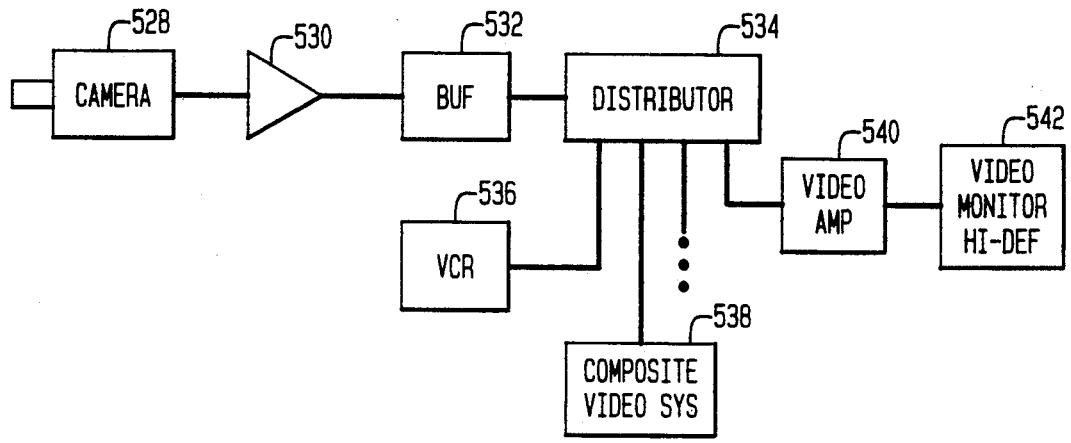
FIG. 9 is a system block diagram of a video system employing a buffer amplifier in accordance with the present invention.

FIG. 9 is a system block diagram of a video system employing a buffer amplifier in accordance with the invention. a video camera 528 produces a video signal which is coupled through a buffer amplifier 530 in accordance with the invention to a video buffer 532. The buffer 532 has an output coupled to a video distributor 534 having a plurality of outputs which may be coupled to various monitors, video recorders such as 536, etc. An output of the distributor 534 is coupled to a composite video system 538, which could include an amplifier, a monitor, a recorder, etc. Another output of the distributor 534 is coupled to a component video system including a video amplifier 540 and a monitor 542, which could be a high definition monitor. If so, it will be understood that the camera 528, the buffer 532, etc. support high definition television technology.

Figure 10:
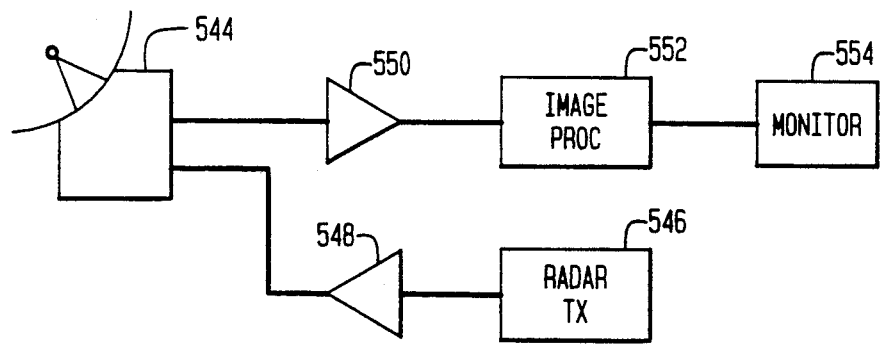
FIG. 10 is a system block diagram of a radar system employing a buffer amplifier according to the present invention.

FIG. 10 is a system block diagram of a radar system employing a buffer amplifier according to the invention. A radar antenna 544 is coupled to a radar transmitter 546 through a buffer amplifier 548 in accordance with the invention. a radar signal from the transmitter 546 is transmitted from the antenna 544. Radar echoes received by the antenna 544 travel through another buffer amplifier in accordance with the invention, shown as 550, to a radar video image processor 552. A processed radar image from the processor 552 is then displayed on a monitor 554.

From these examples, it will be seen that buffer amplifier circuits according to the invention have a wide range of applications in various types of electronic systems.

As will be appreciated from the foregoing description, the drawbacks of conventional buffer amplifier configurations, are obviated by a buffer amplifier configuration which, through the use of a high impedance current source in the collector path of the input transistor to establish a high input impedance, makes its possible to connect the buffer input to the emitter of the input transistor and thereby connect the base-emitter forward voltage dropping junctions of like polarity input and output transistors in complementary directions, so that their d.c. voltage drops effectively cancel. Namely, since both the input and output transistors of a respective stage are of the same polarity type (so that they can be reasonably well matched during manufacture) and have their base-emitter junctions connected back-to-back between the input and output terminals, they impart effectively no Vbe-based d.c. offset voltage through the buffer. Consequently, additional compensating transistor diodes as in the prior art configuration of FIG. 2 are not required, and the output impedance is not increased. Additionally, an isolating transistor stage of the same polarity as the emitter-follower serves to translate the output impedance by the product of the current gains of the output and isolation transistor stages to the collector of the input stage, thus ensuring a high input impedance.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A buffer amplifier comprising:
   an input terminal to which an input signal is applied;
   an output terminal from which an output signal is derived;
   a first reference potential terminal to which a first prescribed reference potential is applied;
   a first bipolar transistor of a first polarity type having an emitter electrode coupled to said input terminal, a base electrode, and a collector electrode;
   a second bipolar transistor of said first polarity type having an emitter electrode coupled to said output terminal, a base electrode coupled to the base electrode of said first transistor and a collector electrode coupled to said first reference potential terminal;
   a first high impedance current source coupled between said first reference potential terminal and the collector of said first transistor: and
   a first means for coupling a signal voltage at the collector electrode of said first transistor to the base electrode of said second transistor; and wherein
   the characteristics of said first and second transistors are such that their respective forward base-emitter junction voltages are effectively the same, so as to minimize a d.c. voltage offset from said input terminal through said first and second transistors to said output terminal.

2. A buffer amplifier according to claim 1, wherein said first means comprises a third bipolar transistor having a base electrode coupled to the collector electrode of said first transistor, a collector electrode coupled to said first reference potential terminal and an emitter electrode coupled to the base electrode of said second transistor.

3. A buffer amplifier according to claim 2, wherein said third bipolar transistor has said first polarity type.

4. A buffer amplifier according to claim 1, further comprising
   a second reference potential terminal to which a second prescribed reference potential is applied;
   a third bipolar transistor of a second polarity type, having an emitter electrode coupled to said input terminal, a base electrode and a collector electrode;
   a fourth bipolar transistor of said second polarity type having an emitter electrode coupled to said output terminal, a base electrode coupled to the base electrode, and a collector electrode coupled to said second reference potential terminal;
   a second high impedance current source coupled between said second reference potential terminal and the collector of said third bipolar transistor; and
   second means for coupling a signal voltage at the collector of said third transistor to the base of said fourth transistor; and wherein
   the characteristics of said third and fourth transistors are such that their respective forward base-emitter junction voltages are effectively the same, so as to minimize a d.c. voltage offset from said input terminal through said third and fourth transistors to said output terminal.

5. A buffer amplifier according to claim 4, wherein said first means comprises a fifth bipolar transistor having a base electrode coupled to the collector electrode of said first transistor, a collector electrode coupled to said first reference potential terminal and an emitter electrode coupled to the base electrode of said second transistor, and wherein said second means comprises a sixth bipolar transistor having a base electrode coupled to the collector electrode of said third transistor, a collector electrode coupled to said second reference potential terminal and an emitter electrode coupled to the base electrode of said fourth transistor.

6. A buffer amplifier according to claim 5, wherein said fifth transistor is of said first polarity type and said sixth transistor is of said second polarity type.

7. A buffer amplifier according to claim 1, wherein said first means comprises a conductive link for connecting the collector and base of said first transistor in common so that said first transistor is electrically configured as a diode-connected transistor.

8. A buffer amplifier according to claim 4, wherein each of first and second means comprises a respective conductive link for connecting the collector and base of said first transistor in common and for connecting the collector and base of said third transistor in common, so that each of said first and third transistors is electrically configured as a respective diode-connected transistor.

9. A buffer amplifier circuit comprising:
an input terminal to which an input signal is applied;
an output terminal from which an output signal is derived;
a reference potential terminal to which a prescribed reference potential is applied;
a first transistor of a prescribed polarity type having an input electrode, an output electrode coupled to said input terminal and a control electrode, said first transistor having an internal d.c. voltage drop between its control electrode and its output electrode;
a second transistor of said prescribed polarity type having an input electrode coupled to said reference potential terminal, an output electrode coupled to said output terminal and a control electrode coupled to the control electrode of said first transistor, said second transistor having an internal d.c. voltage drop between its control electrode and its output electrode;
a high impedance current source coupled between said reference potential terminal and the input electrode of said first transistor; and
means for coupling a signal voltage at the input electrode of said first transistor to the control electrode of said second transistor; and wherein
the electronic characteristics of said first and second transistors are such that said internal d.c. voltage drops are effectively the same, so as to minimize a d.c. voltage offset from said input terminal through said first and second transistors to said output terminal.

10. A buffer amplifier according to claim 9, wherein said means comprises an amplifier circuit for amplifying a signal voltage at the input electrode of said first transistor and applying an amplified signal voltage to the control electrode of said second transistor.

11. A buffer amplifier according to claim 10, wherein said first and second transistors comprise like polarity bipolar transistors, and wherein their internal d.c. voltage drops correspond to forward base-emitter junction voltages.

12. A buffer amplifier comprising:
an input terminal to which an input signal is applied;
an output terminal from which an output signal is derived;
a first reference potential terminal to which a first reference potential is applied;
a second reference potential terminal to which a second reference potential is applied;
a first transistor of a first polarity type having an input electrode, an output electrode coupled to said input terminal and a control electrode, said first transistor having an internal d.c. voltage drop between tis control electrode and its output electrode;
a second transistor of said first polarity type having an input electrode coupled to said first reference potential terminal, an output electrode coupled to said output terminal and a control electrode coupled tot he control electrode of said first transistor, said second transistor having an internal d.c. voltage drop between its control electrode and its output electrode;
a first high impedance current source coupled between said first reference potential terminal and the input electrode of said first transistor;
first means for coupling a signal voltage at the input electrode of said first transistor to the control electrode of said second transistor;
a third transistor of a second polarity type having in input electrode, an output electrode coupled to said input terminal and a control electrode, said third transistor having an internal d.c. voltage drop between its control electrode and its output electrode;
a fourth transistor of said second polarity type having an input electrode coupled to said second reference potential terminal, an output electrode coupled to said output terminal and a control electrode coupled to the control electrode of said third transistor, said fourth transistor having an internal d.c. voltage drop between its control electrode and its output electrode;
a second high impedance current source coupled between said second reference potential terminal and the input electrode of said third transistor; and
second means for coupling a signal voltage at the input electrode of said third transistor to the control electrode of said fourth transistor; and wherein
the electronic characteristics of said first and second transistors are such that their internal d.c. voltage drops are effectively the same, so as to minimize a d.c. voltage offset from said input terminal through said first and second transistors to said output terminal and the electronic characteristics of said third and fourth transistors are such that their internal d.c. voltage drops are effectively the same, so as to minimize a d.c. voltage offset from said input terminal through said third and fourth transistors to said output terminal.

13. A buffer amplifier according co claim 12, wherein said first means comprises a first amplifier circuit for amplifying a signal voltage at the input electrode of said first transistor and applying an amplified signal voltage to the control electrode of said second transistor, and said second means comprises a second amplifier circuit for amplifying a signal voltage at the input electrode of said third transistor and applying an amplified signal voltage to the control electrode of said fourth transistor.

14. A buffer amplifier according to claim 13, wherein said first and second transistors comprise NPN bipolar transistors, and wherein their internal d.c. voltage drops correspond to forward base-emitter junction voltages, and said third and fourth transistors comprise PNP bipolar transistors, and wherein their internal d.c. voltage drops correspond to forward base-emitter junction voltages.

15. A buffer amplifier according to claim 12, further including a third current source coupled between said first reference potential terminal and the control electrode of said fourth transistor and a fourth current source coupled between said second reference potential terminal and the control electrode of said second transistor.

16. An electronic system comprising:
a first electrode at which a voltage is provided;
a second electrode; and
means for coupling the first and second electrode together to provide the voltage to the second electrode at a low voltage offset, the means including a buffer amplifier which comprises:
(a) an input terminal,
(b) an output terminal,
(c) a first reference potential terminal to which a first prescribed reference potential is applied,
(d) a first bipolar transistor of a first polarity type having an emitter electrode coupled to said input terminal, a base electrode, and a collector electrode,
(e) a second bipolar transistor of said first polarity type having an emitter electrode coupled to said output terminal, a base electrode coupled to the base electrode of said first transistor and a collector electrode coupled to said first reference potential terminal,
(f) a first high impedance current source coupled between said first reference potential terminal and the collector of said first transistor, and
(g) first means for coupling a signal voltage at the collector electrode of said first transistor to the base electrode of said second transistor,
wherein the characteristics of said first and second transistors are such that their respective forward base-emitter junction voltages are effectively the same, so as to minimize a d.c. voltage offset from said input terminal through said first and second transistors to said output terminal.

17. An electronic system as recited in claim 16 wherein the electronic system includes a computer system.

18. An electronic system as recited in claim 16 wherein the electronic system includes an automotive electronic system.

19. An electronic system as recited in claim 16 wherein the electronic system includes a video system.

20. An electronic system as recited in claim 19 wherein the video system includes one of a component video system, a composite video system, a high definition television system, a video buffer system, and a video distribution system.

21. An electronic system as recited in claim 16 wherein the electronic system includes a radar system.

22. An electronic system as recited in claim 21 wherein the radar system includes a video radar image processor.

23. A method for manufacturing a low offset buffer amplifier circuit comprising the steps of:
laying out a buffer amplifier circuit including:
(a) an input terminal to which an input signal is applied,
(b) an output terminal from which an output signal is derived,
(c) a first reference potential terminal to which a first prescribed reference potential is applied
(d) a first bipolar transistor of a first polarity type having an emitter electrode coupled to said input terminal, a base electrode, and a collector electrode,
(e) a second bipolar transistor of said first polarity type having an emitter electrode coupled to said output terminal, a base electrode coupled to the base electrode of said first transistor and a collector electrode coupled to said first reference potential terminal,
(f) a first high impedance current source coupled between said first reference potential terminal and the collector of said first transistor, and
(g) first means for coupling a signal voltage at the collector electrode of said first transistor to the base electrode of said second transistor,
wherein the characteristics of said first and second transistors are such that their respective forward base-emitter junction voltages are effectively the same, so as to minimize a d.c. voltage offset from said input terminal through said first and second transistors to said output terminal; and
trimming the first and second transistors to further match the characteristics of the first and second transistors.

24. A method as recited in claim 23 wherein the first high impedance current source includes a component whose value is related to the current supplied by the current source, and the method further comprises the step of trimming the component to set a precise value of current supplied by the current source.

25. A low offset buffer amplifier circuit produced by a method comprising the steps of:
laying out a buffer amplifier circuit including:
(a) an input terminal to which an input signal is applied,
(b) an output terminal from which an output signal is derived,
(c) a first reference potential terminal to which a first prescribed reference potential is applied
(d) a first bipolar transistor of a first polarity type having an emitter electrode coupled to said input terminal, a base electrode, and a collector electrode,
(e) a second bipolar transistor of said first polarity type having an emitter electrode coupled to said output terminal, a base electrode coupled to the base electrode of said first transistor and a collector electrode coupled to said first reference potential terminal,
(f) a first high impedance current source coupled between said first reference potential terminal and the collector of said first transistor, and
(g) first means for coupling a signal voltage at the collector electrode of said first transistor to the base electrode of said second transistor,
wherein the characteristics of said first and second transistors are such that their respective forward base-emitter junction voltages are effectively the same, so as to minimize a d.c. voltage offset from said input terminal through said first and second transistors to said output terminal; and trimming the first and second transistors to further match the characteristics of the first and second transistors.

26. A low offset buffer amplifier circuit as recited in claim 25 wherein the step of laying out includes laying out the first high impedance current source to include a component whose value is related to the current supplied by the current source, and the method further comprises the step of trimming the component to set a precise value of current supplied by the current source.

* * * * *